United States Patent
Quayle et al.

(10) Patent No.: US 10,198,538 B1
(45) Date of Patent: Feb. 5, 2019

(54) RELOCATE TARGETS TO DIFFERENT DOMAINS IN AN EMULATOR

(71) Applicant: CADENCE DESIGN SYSTEMS, INC., San Jose, CA (US)

(72) Inventors: Barton Quayle, San Jose, CA (US); Mitchell G. Poplack, San Jose, CA (US); Sundar Rajan, Palo Alto, CA (US); Chuck Berghorn, Staatsburg, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 458 days.

(21) Appl. No.: 14/981,270

(22) Filed: Dec. 28, 2015

(51) Int. Cl.
*G06F 17/50* (2006.01)
*G06F 15/173* (2006.01)
*H03M 1/66* (2006.01)

(52) U.S. Cl.
CPC ...... *G06F 17/5027* (2013.01); *G06F 17/5031* (2013.01); *G06F 15/17343* (2013.01); *H03M 1/662* (2013.01)

(58) Field of Classification Search
None
See application file for complete search history.

(56) References Cited

U.S. PATENT DOCUMENTS

| | | | | |
|---|---|---|---|---|
| 5,425,036 A | * | 6/1995 | Liu | G06F 17/5027 714/725 |
| 5,551,013 A | * | 8/1996 | Beausoleil | G06F 17/5027 703/23 |
| 5,960,191 A | * | 9/1999 | Sample | G01R 31/2853 703/23 |
| 6,051,030 A | * | 4/2000 | Beausoleil | G06F 15/8023 703/20 |
| 7,739,093 B2 | * | 6/2010 | Beausoleil | G06F 17/5027 703/14 |
| 9,495,492 B1 | * | 11/2016 | Ramabadran | G06F 17/5031 |
| 9,647,688 B1 | * | 5/2017 | Poplack | H03M 13/03 |
| 9,904,759 B1 | * | 2/2018 | Rajan | G06F 17/5081 |
| 2004/0146072 A1 | * | 7/2004 | Farmwald | H04L 12/2856 370/537 |

(Continued)

*Primary Examiner* — Kibrom K Gebresilassie
(74) *Attorney, Agent, or Firm* — Eric L. Sophir; Dentons US LLP

(57) ABSTRACT

The embodiments described herein may improve utilization of an emulator system's resources, and may improve efficiency and effectiveness in bug-identification and/or target-debugging; the components described herein may improve utilization of the emulator's resources, reduce wait time to execute emulation routines, and may limit or eliminate the need to stop or kill emulations in process. The various embodiments described herein allow for dynamically associating domains and targets by dynamically allocating and assigning domains with particular target connections, which are pins and/or wires that connect target pods to the emulation system. An emulation system may comprise one or more target MUXs that are situated between the target connections and the domains, to allow the relationships between target pods and domains to be identified and switched dynamically. The target MUXs may be reprogrammed while emulations are ongoing, in order to redirect data communications between available domains and target pods of target systems.

17 Claims, 4 Drawing Sheets

(56) References Cited

U.S. PATENT DOCUMENTS

| | | | | |
|---|---|---|---|---|
| 2004/0254906 | A1* | 12/2004 | Shei | G06F 11/261 703/23 |
| 2005/0267727 | A1* | 12/2005 | Poplack | H04L 43/50 703/25 |
| 2006/0190237 | A1* | 8/2006 | Beausoleil | G06F 17/5022 703/23 |
| 2008/0288236 | A1* | 11/2008 | Schmitt | G06F 17/5027 703/23 |
| 2009/0271174 | A1* | 10/2009 | Cha | G06F 11/261 703/28 |
| 2011/0099407 | A1* | 4/2011 | Jonas | H03K 19/17744 713/400 |
| 2011/0264436 | A1* | 10/2011 | Ni | G06F 11/3652 703/28 |

* cited by examiner

RELOCATE TARGETS TO DIFFERENT DOMAINS IN AN EMULATOR

TECHNICAL FIELD

This application relates generally to integrated circuit design and testing systems, methods, and products.

BACKGROUND

Emulation systems may comprise hardware components, such as emulation chips and processors, capable of processor-based (e.g., hardware-based) emulation of logic systems, such as integrated circuits (ICs), application specific integrated circuits (ASICs), central processing units (CPUs), graphics processing units (GPU), field-programmable gate arrays (FPGAs), and the like. By executing various forms of programmable logic, the emulation chips may be programmed to mimic the functionality of nearly any prototype logic system design that is undergoing testing. Processor-based emulation allows logic system designers to prototype a logic system's design, before a manufacturer expends resources manufacturing a logic system product based on the design.

After emulation system customers or users (e.g., logic system designers) submit their design for emulation from their computing devices, the users may logically and/or physically attach to the emulator system a hardware target device, such as a target pod, which communicates data signals regarding to the ongoing emulation. In the past, target connections have always been statically tied to specific domains of the emulator system, which are predefined collections of system resources assigned to execute an emulation. But when an assigned domain was in use for another processing job or was otherwise unavailable, the target could neither transmit input signals to the emulator system, nor receive outputs from the emulator system. In sum, even though a problem would be isolated to just one or more domains of the emulation system, the emulator system would be rendered altogether unavailable to the target. Thus, one user could not test their logic system design, while others could, and while other portions of the emulation system were still operational or otherwise available.

Ultimately, the practical effect of this shortcoming is underutilization, or less-than-optimal use of the emulator system and its components. For instance, the workload of busy domains cannot be shifted to available domains. In addition, the static relationships between domains and target connections often make it difficult to debug problems with the targets and the logic system being tested, because it can be difficult to locate where problems exist—e.g., determining whether poor performance lies with the design of the logic system being tested or the hosting test bench components of the emulation system.

What is needed is a means of breaking up the static relationship that exists in conventional emulation systems between domains and target connections. Also, what is needed is a means for dynamically associating domains with target connections, and, in some cases, a means for dynamically identifying the need to update or generate associations between domains and target connections. In order to allow targets to be connected to any number of multiple domains, what is needed is a means for allowing domains and targets to be allocated and scheduled independently from other targets and other domains.

SUMMARY

Disclosed herein are systems and methods capable of addressing the above-described shortcomings in the art, and may also provide any number of additional or alternative benefits and advantages. For example, the embodiments described herein may improve utilization of an emulator system's resources, and may improve efficiency and effectiveness in bug-identification and/or target-debugging; the components described herein may improve utilization of the emulator's resources, reduce wait time to execute emulation routines, and may limit or eliminate the need to stop emulations in process. The various embodiments described herein allow for dynamically associating domains and targets by dynamically allocating and assigning domains with particular target connections, which are pins and/or wires that connect target pods to the emulation system. One aspect of an emulation system that facilitates these features includes one or more target multiplexers (target MUXs) that are situated between the target connections and the domains, to allow the relationships between target pods and domains to be identified and switched dynamically. The target MUXs may be reprogrammed while emulations are ongoing, in order to redirect data communications between available domains and target pods of target systems.

In one embodiment, a method for adaptively driving signals among components of an emulation system comprises receiving, by a target multiplexer of an emulation system, one or more signals from a first domain of resources of the emulation system, the one or more signals outputted by the first domain to a first target pod coupled to the emulation system; and transmitting, by the target multiplexer, the one or more signals to a second target pod according to a target value instruction of a second instruction set executed by the target multiplexer.

In another embodiment, a circuit emulation system comprising one or more domains of system components, each respective domain comprising one or more processors of the emulation system, each respective processor configured to execute one or more processing jobs according to an instruction set executed by the respective processor, each domain configured to output one or more signals to at least one target pod identified by a target value of an instruction set executed by component of the domain; and a target multiplexer configured to receive the one or more signals outputted by the domain to a first target pod, and transmit the one or more signals to a second target pod in accordance with a target value of an instruction set executed by the target multiplexer.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

DETAILED DESCRIPTION

Figure 1:
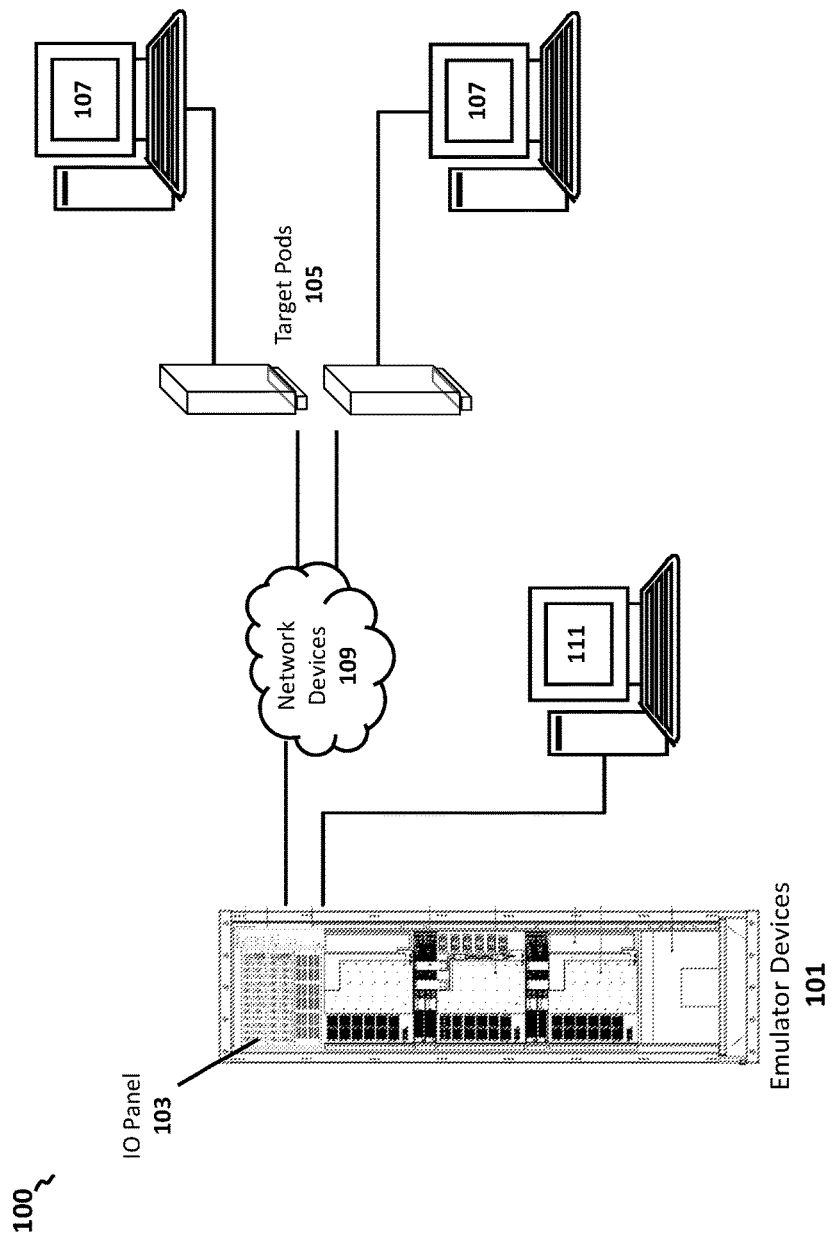
FIG. 1 shows components of an emulation system, according to an exemplary system embodiment.

The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

FIG. 1 shows components of an exemplary emulation system 100, according to an exemplary embodiment. The system 100 may comprise any number of emulation devices 101 that are configured to emulate logic systems (e.g., ASIC, FPGA, GPU, CPU) in order to test the design of those logic systems. The emulation system 100 may further comprise any number of target systems (e.g., target pods 105, client devices 107) that may be directly coupled to the emulator devices 101 or may be indirectly coupled to the emulator devices 101 via any number of network devices 109. In some cases, an administrative computer 111 may be coupled directly or indirectly to the emulator devices to control aspects of how emulator devices execute.

FIG. 1 illustrates relationships between various components of system 100, including emulator devices 101 and target pods 105, as being physically and logically organized into one or more cabinets or housings. However, it should be appreciated that there is no requirement for any components of an emulation system 100 to be logically or physically organized into such containers. Rather, the emulator devices 101 may be logically and physically organized within the same or different devices or structures, and may be distributed across any number of physical structures and locations (e.g., cabinets, rooms, buildings, cities).

Emulator Devices

Emulator devices 101 may be devices of an emulation system 100 responsible for compiling and executing emulation routines. Non-limiting examples of emulation devices 101 may include emulation chips, logic boards, data buses, wiring interfaces, data lanes, non-transitory machine-readable media, and processors, among others. The emulator devices 101, such as emulation chips, may be preprogrammed to process data inputs and generate data outputs according to instructions generated by compiling a schematic design ("netlist") of a particular logic system. A processor of the emulation system 100 may programmatically compile a machine-readable netlist file into executable code, which is then distributed as instruction sets to one or more emulation chips of the system. For each of the components of the system 100 receiving an instruction set, the instructions indicate which other component of the system 100 is the source of a particular component's next data input, and which other component of the system 100 is the destination of the particular component's next data output.

The emulator devices 101 may be logically organized into domains, which are subsets of the emulation devices 101 allocated to execute a particular emulation. Domains may be the smallest unit of hardware resources of the emulator devices 101 that the emulation system 100 is capable of allocating to emulate a logic system design associated with a target system. Each domain may comprise one or more emulation devices 101 allocated by a configuration module to execute a particular emulation routines, in order to emulate a logic system design of a target system. A domain (e.g., set of hardware resources) may be configured with execution parameters independent from both other domains and the rest of an emulation system 100 as whole. For example, each domain may comprise a separate execution clock that is independent from a system clock, and thus the domain may be independently schedulable from a user's perspective. It should be appreciated that a domain may be defined at any level of granularity within the system, and may comprise any collection of hardware resources of the emulation system 100. Non-limiting examples of what constitutes a domain may include: one or more emulation chips, one or more processors on emulation chips, logical circuit boards, clusters of logical circuit boards, and any other collection hardware components that may be allocated to execute according to an independent clock. Without limiting the scope of what constitutes a domain, and for ease of discussion, domains, as used herein, comprise one or more emulation chips.

Generally, after one or more domains are allocated to emulate a design submitted for a target system, the components of a particular allocated domain may be configured to communicate data to and from the devices of the allocated target system. Accordingly, at least one of the allocated domains may be directly coupled (via an I/O panel 103) or indirectly coupled (via various network devices 109) to a device of the respective target system, such as a target pod 105, so that the devices may communicate data related to emulation routines. Domains and target pods 105 may be indirectly coupled as result of instruction sets compiled by a compiler using a netlist file and subsequently provided to the respective emulation chips of the allocated domain. The executable instructions of an instruction set instructs an emulation chip that the emulation chip should receive data inputs and instructions from the respective target pod 105 and that the emulation chip should likewise transmit data outputs to the target pod 105. The target pod 105 may receive and store the data outputted by the associated emulation chip (e.g., domain) and may then make the data available to a client computing device 107 for user or administrator review.

A domain may be allocated to, and associated with, a target pod 105 by a configuration manager. The configuration manager may be one or more software modules executed by the emulation devices 101, and configured to manage allocation of system resources and the execution of emulation routines. In some cases, an administrator or an end-user of the emulation system 100 may interact with the configuration manager to in order to provide user inputs indicating that one or more domains of the system 100 should be allocated to execute a particular emulation, from a respective target system. Additionally or alternatively, in some cases, the configuration manager may automatically determine which domain should be allocated to execute a particular emulation. In such cases, the configuration manager may detect and identify domains that are available (e.g., functional, not busy), but may also make the determination based on any number of optional criteria. For example, the configuration manager may determine which of the available domains to allocate to an emulation and respective target pod 105 based on, for example, the most efficient domain given the processing demands of the emulation, the most effective domain given the processing demands of the emulation, and the physically closest domain to the target pod 105, among other possible criteria.

Target Systems

Target systems (e.g., target pods 105, client devices 107) may include one or more computing devices configured to send and receive instructions and data values driving execution of emulation routines by emulator devices 101. A target system may be configured to host an operating environment, or at least aspects of the operating environment, where the logic system (e.g., ASIC, CPU, GPU) currently being tested will ultimately be installed. As shown in FIG. 1, a target system may include a target pod 105 coupled to a client device 107. However, it should be appreciated that a target system may comprise any number of devices required to complete the emulation routines. Target Systems may comprise circuitry, software, firmware, and/or any number of devices that connect and interact with emulator devices 101 on behalf of users (e.g., provide test signals to an emulator executing a compiled netlist). Design netlists may be generated and compiled in order to appropriately connect and direct data values between the emulation devices 101 to the target system. The connections and interactions between a target system and the emulator devices 101 may be established and supported via target pods 105, or any other electronic device capable of performing the same or similar functions of a target pod 105 as described herein.

In operation, a target pod 105 may transmit instructions and values to the emulator devices 101, which, in turn, execute the instructions received from the target pod 105 or uses the values as inputs to execute preprogrammed processes, in order to emulate the functions of the particular logic system being tested. After the emulation system 100 executes preprogrammed instructions and/or any instructions received from the target pod 105, the emulation system 100 may then generate instructions and/or output data values, which the emulation system 100 then transmits to the target pod 105. As mentioned, the target pod 105 may comprise machine-readable memory configured to store the various data outputs produced by the emulation system 100, after the emulation system 100 executes the various processes that emulate the behavior of the logic system being tested. The results are output to a user interface of a client computing device 107, which executes various software modules associated with the emulation system 100. In addition, the client computing device 107 may provide an end user with various customization or management features, so that an end user may configure various aspects of the emulation and the emulation routines. For example, a user may employ the client device 107 to submit a netlist file containing a representation of the features of the logic system design being tested, to a compiler module executed by the emulator devices 101. The resulting binary code, produced from the compiled netlist file, is then used to configure certain emulator devices 101 to execute the various emulation routines of the compiled netlist.

A target pod 105 may be any computing device comprising a processor that executes various preprogrammed processes intended to test a logic system design, and/or non-transitory machine-readable storage media that stores various data inputs and outputs produced by the target pod 105 or received from the emulation system 100. That is, the target pods 105 may generate computing instructions and/or values that test the functions and quality of the logic system design. It should be appreciated that a target pod 105 may be a distinct, standalone device, as shown in FIG. 1, but a target pod 105 may also be integrated into another computing device that is in communication with various other components of the emulation system 100. For example, in some cases the client computer 107 may also be a target pod 105. A target pod 105 may be automatically programmed by software modules executed by the emulator devices 101, such as configuration software modules, but may also be manually programmed and managed by a user or administrator, using a user interface program provided at an I/O panel 103, a client computer 107, and/or an administrative computer 111.

The target pods 105 may be coupled to the emulator devices 101 through an I/O interface panel 103 using one or more interface protocols and hardware (e.g., communication cable assemblies) capable of supporting communication between a target pod 105 and the emulator devices 101, including Infiniband, Ethernet, PCI, optics, and the like. The target pod 105 may connect to the I/O panel 103 through any number of cables and/or network devices 109, such as an Ethernet cable and an optical cable. The target pod 105 may plug directly into a client computer 107, through any number of ports of the client computer 107 (e.g., USB, Serial, PCI); or the target pod 105 may be connected indirectly to a target system via one or more connector adapters, data processors, network devices 109, or other electronic communications devices. In some cases, target pods 105 may be proximate to the emulator devices 101, and may therefore communicate through the I/O panel 103 using, for example, a PCI bus. For example, the emulator devices 101 may often be located within the same physical housing (e.g., cabinet, server rack) or proximate physical structures, allowing the emulator devices 101 to communicate via high-speed connection protocols, such as one or more PCI buses. In this example, the target pod 105 may share the physical structure or may be proximately located to the structure, and thus may take advantage of the same or similar high-speed protocols, like the PCI buses. But in some embodiments, a target pod 105 may be located outside of such a physical structure containing the emulator devices 101, or the target pod may be outside the proximity of the physical structure (e.g., different room, floor, building), which means there is no PCI interface capable of linking the target pod 105 to the rest of the emulation devices 101. In such embodiments, communication between the emulation devices 101 and the target pod 105 may occur through any number of networking devices 109, using any number of computer networking-related interfaces and protocols. For example, communication between the emulation system 100 and the target pod 105 may be performed through Ethernet, Infiniband, optical fiber, and the like.

Computing Devices

A client computing device 107 may be used for controlling or otherwise managing various aspects of the emulation system 100, such as submitting a netlist design file for a new or updated logic system design that a user wants to test through emulation. The client computing device 107 may be logically internal or external to a computer network containing one or more emulator devices 101. For example, the client computing device may be logically outside of a firewall functioning as a gateway to the network of the emulator devices 101. The client computing device 107 may be any computing device capable of performing the various tasks and process described herein, such as configuring components of the emulation system 100 (e.g., netlists, chips, processors, logic boards, configuration manager) to emulate the particular logical system (e.g., ASIC, CPU, GPU) being tested. Non-limiting examples of the client computing device 107 may include a workstation computer, a laptop computer, a tablet device, a server computer, and the like. In some cases, the client computing device 107 may be proximate to the emulator devices 101, and may therefore be coupled to the emulator devices 101 through an I/O panel 103 using, for example, an Infiniband connection. In some cases, the client computing device 107 may not be proximate to the emulator device 101, or may be logically external to a computer network hosting the emulator devices 101 (e.g., outside of a firewall). In such cases, the client computing device 107 may be connected to the emulator devices 101 through an I/O panel 103 using, for example, an Ethernet connection. Additionally or alternatively, in some instances, the client computing device 107 may be integrated into the emulator devices 101 and/or I/O panel 103, thereby forming a single device for emulating logic system designs.

An administrative computer 111 may be used by a system administrator or an end-user to manage the emulator devices 101, and to configure aspects of emulation routines. The administrative computer 111 may be any computing device comprising a processor that executes various software modules instructing the administrative computer 111 to execute the various tasks and processes described herein. Non-limiting examples of an administrative computer may include a laptop computer, a workstation computer, a tablet, a server, and the like. The administrative computer 111 may allow the administrator or end-user to define certain execution parameters of how the emulator devices 101 execute emulation routines. For example, like with some embodiments of the client device 107, an administrative computer 111 may be used expressly allocate resources of the emulation devices 101 to perform certain emulation routines. As another example, the administrative device 111 may be used submit or modify a netlist file to begin a new emulation. In a further example, in the event an emulation routine does not function as expected, the administrative computer 111 may be used to troubleshoot and reconfigure the emulation devices 101, and/or debug aspects of compiled code or netlist file.

In some embodiments, the administrative computer 111 may be proximate to the emulator devices 101 or logically internal to a network hosting the emulator devices 101. In such embodiments, the administrative computer 111 may be coupled to the emulator devices 101 through an I/O panel 103 using, e.g., an Infiniband connection. In some embodiments, the administrative computer 111 may not be proximate to the emulator device 101, or may be logically external to a computer network hosting the emulator devices 101 (e.g., outside of a firewall). In such cases, the administrative computer 111 may be connected to the emulator devices 101 through an I/O panel 103 using, for example, an Ethernet connection. Additionally or alternatively, in some instances, the administrative computer 111 may be integrated into the emulator devices 101 and/or I/O panel 103, thereby forming a single device for managing the systems that emulate logic system designs.

In many conventional solutions, complications may arise where domains are statically associated with target systems (e.g., target pods 105). Unlike such conventional solutions, the emulation system 100 comprises components capable of dynamically manipulating which domain executes the emulation routines for a given target system.

System Interconnectivity

The system 100 may comprise any number of network devices 109 configured to facilitate inter-device communications. Components of the emulation system 100 may be networked together through one or more means of connecting or networking computing devices. Accordingly, the system 100 may comprise any number of hardware and software components that facilitate networked communication over the related protocol. For example, emulation devices 101 physically housed within one cabinet may communicate with emulation devices 101 housed within a second cabinet, may communicate over an Infiniband. In this example, the system may comprise Infiniband cables, an Infiniband switch, and an I/O panel 103 capable of translating, sending, and receiving data packets using the Infiniband protocols. Additionally or alternatively, network devices 109 may be configured to facilitate communication using, for example, Ethernet, PCI buses, and the like.

Moreover, the emulator devices 101 of the system 100 may comprise one or more I/O panels 103 integrated into the emulator devices 101, and/or the emulator devices 101 may be coupled to one or more I/O panels 103 embodied in distinct devices. An I/O panel 103 may comprise any number of physical and logical interfaces configured to couple the emulation devices 101 to components of target systems, such as client devices 107 and target pods 105. As an example, a remotely located target pod 105 may connect to the emulator devices 101 over Ethernet, and thus the I/O interface panel 103 may be comprise an RJ45 port, and may be configured to communicate using TCP/IP protocols. Other non-limiting examples of the various physical and logical interface technologies that may be facilitated by the I/O panel 103 may include Infiniband and optical connections, among others.

Figure 2A:
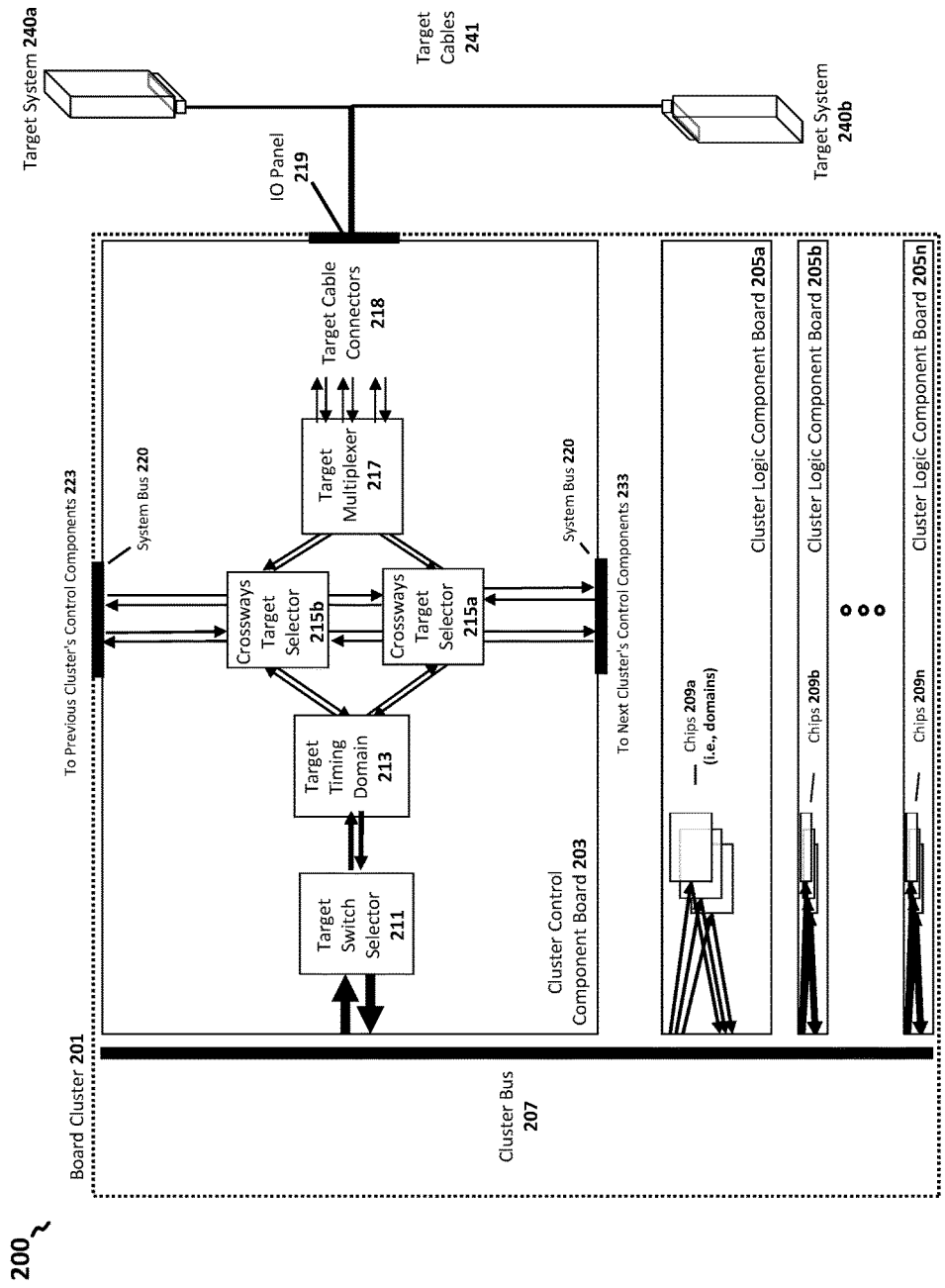
FIG. 2A shows greater detail of emulator devices and target devices of an emulation system, according to an exemplary embodiment.
Figure 2B:
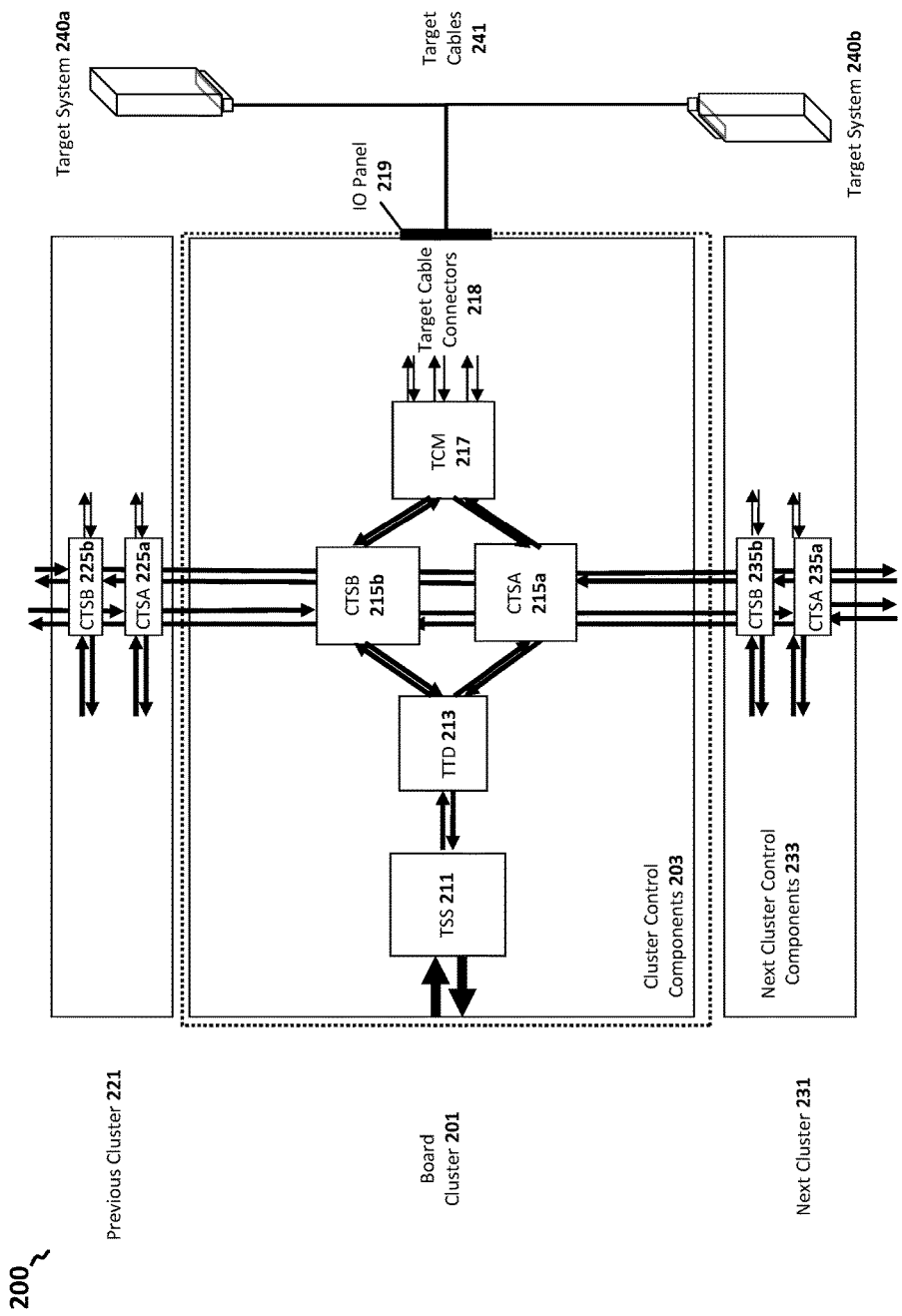
FIG. 2B shows greater detail of emulator devices and target devices of an emulation system, according to an exemplary embodiment.

FIG. 2A and FIG. 2B show greater detail of emulator devices and target devices of an emulation system 200, according to an exemplary embodiment. In the exemplary system 200, the emulator devices may be logically and physically organized into any number of board clusters 201, 221, 231. A cluster 201 may communicate data signals with one or more target pods 240 that connect a customer's target system to the various components of the emulation system 200. A I/O panel 219 comprising various interface components, connects target systems 240 to the emulation system 200.

Clusters of Logic Boards

As mentioned, logic boards of the system 200 may be organized into board clusters 201, 221, 231. A board cluster 201, as shown in FIG. 2A, may be a collection of circuit boards and related circuitry, including a control board 203, one or more logic boards 205, and one or more cluster buses 207. It should be appreciated that a cluster 201 is merely intended as a logical collection of components of an emulation system 200, and serves as an organizational module of components, to ease various processing overhead burdens on the components of the system 200. One having ordinary skill in the art would appreciate that an emulation system 200 might not be organized into any modular clusters, or might also be organized into any number of components into any number of clusters, at any level of abstraction. For example, chips 209 may or may not be organized into chip clusters; and similarly, chip clusters may or may not be organized together onto a logic component board 205.

A cluster 201 may have one or more cluster buses 207 comprising circuitry and/or wiring cables configured to transport data between components of the cluster 201. For instance, a cluster bus 207 may transport data between the control board 203 and a particular logic board 205*a*. A cluster bus 207 may use any data communication protocols and hardware components capable of supporting the various data signals communicated between the components of the cluster 201. Non-limiting examples of a cluster bus 207 may include PCI, Infiniband, optical connections, and the like.

Similarly, the emulation system 200 may comprise one or more system buses 220. A system bus 200 may comprise circuitry or wiring cables configured to transport data among clusters 201, 221, 231, or between target pods 204 and clusters 201, 221, 231. A system bus 220 may use any data communication protocols and hardware components capable of supporting data communications among clusters 201, 221, 231, and/or between target pods 240 and the clusters 201, 221, 231. Non-limiting examples of a system bus 220 may include PCI, Ethernet, Infiniband, optical connections, and the like.

Logic Boards

A cluster 201 may comprise any number of cluster logic boards 205. Logic boards 205 may be circuit boards comprising any number of logic components configured to execute the various emulation routines of a compiled netlist. In particular, logic boards 205 may contain any number of emulation chips 209. An emulation chip 209 may be an integrated circuit comprising one or more processors configured to execute the various processes of a particular emulation, according to an instruction set received from a compiler. In some cases, the chips 209 may be clustered into any number of chip clusters, each having one or more chips 209. IN addition to having one or more emulation chips 209, logic boards 205 may comprise data lanes configured to transport data signals. Within a logic board 205a, the data lanes may carry data signals between emulation chips 209a of the board 205a, and from the emulation chips 209a of the logic board 205a to a cluster bus 207.

Control Board and Control Components

A cluster control board 203 may be any circuit board comprising cluster control components, which may be a collection of one or more integrated circuits (e.g., ASIP, FPOA, PAL, FPGA, ASIC) configured to execute the various processes associated with managing and directing data communications in and out of the cluster 201, and among components of the cluster 201. More specifically, cluster control components on a cluster control board 203 may include a target switch selector 211, a target timing domain 213, one or more crossways target selectors 215, a target cable multiplexer (target MUX 217), and target cable connectors 218. Although the exemplary system 200 shows a cluster control board 203 having each of the above-referenced cluster control components, it should be appreciated that some embodiments of an emulation system 200 may omit one or more of the herein described cluster control components or may include additional cluster control components.

In operation, cluster control components on the cluster control board 203 manage various aspects of how the cluster 201 executes the emulation routines and how the cluster 201 moves data bits around the system 200. In particular, the cluster control components may direct data, to and from, various components within the emulation system 200. For example, the cluster control components may direct data communications among cluster logic boards 205a-n within the cluster 201, and among other board clusters 221, 231 within the system 200. As mentioned previously, the emulation system 200 may comprise any number of domains. Domains may be logical collections of components of the system 200, and the cluster control components may be responsible for controlling the inputs and outputs of data signals, to and from the domains of the system 200. In the exemplary system 200, a domain may comprise one or more emulator chips 209a within a particular logic component board 205a. The domain may be associated with a particular emulation project received from a particular target system 240a, and thus the one or more emulator chips 209a of the domain may be configured to communicate data inputs and outputs with that particular target system 240a. But in some circumstances, the cluster control components may be dynamically reconfigured to switch which target system 240a, 240b is associated with which domain. In such circumstances, the cluster control components may be initially configured at compile time to direct data signals between a first target system 240a and an emulator chip 209a of a domain, but then be reconfigured to direct data signals between a second target system 240b and the emulator chip 209a of the domain. Alternatively, in such circumstances requiring dynamic reconfiguration, the cluster control components could be reconfigured to direct data signals between the first target system 240a and a second emulator chip 209b of a second domain.

The cluster control components may comprise a target selector switch 211, which may be a multiplexer configured to connect and direct signals to and from cluster logic boards 205 of the cluster 201. The target selector switch 211 may select data (in each direction) for connection to target cables 218. These selected channels are then logically connected to a target timing domain 213.

The cluster control components may comprise a target timing domain 213, which may be a circuit (e.g., FPGA) configured to re-synchronize incoming signals from the cluster logic components 205, via the target selector switch 211, and may then link-up the signals with the target system 240 over a system bus 220, such as an optical cable link.

The cluster control components may comprise one or more crossways target selectors 215, which may be multiplexers that are situated on the cluster control board 203 between a target timing domain circuit 213, the target mux 217, and the system bus 220 that connects the cluster 201 to previous cluster 221 and a next cluster 231. In some embodiments, optical transceivers may manage the communications between the cluster 201 and the system bus 220, thereby managing the communication among the various cluster control boards 203, 223, 233. The crossways target selectors 215 may be configured to support rearranging target lanes among target connections 218 across the system 200.

The cluster control components may comprise a target multiplexer (target MUX 217). The target MUX 217 may be a multiplexer situated between domains (e.g., emulation chips 209) and target connectors 218, thereby logically coupling the target systems 240 to the emulation system 200. The target MUX 217 may be configured to dynamically change the communication connections among the domains and the target systems 240. In the exemplary system 200, the target MUX 217 may be situated on a cluster control board 203, between the crossways target selectors 215 and the target cable connectors 218, and may be configured to direct data communications between the crossways target selectors 215 and the target connectors 218. The target MUX 217 may allow a particular target system 240 associated with a particular domain to communicate with a different domain during runtime and thus executes as though the target system 240 was always associated with the different domain. Likewise, the target mux 217 may allow a particular domain (e.g., emulation chip 209a) associated with a particular target system 240, to communicate with a different target system 240 during runtime, and thus executes as though the domain was always associated with the different target system 240. Similar to the capability of relocating domains and/or target systems 240, the target MUX 217 may also allow targets systems 240 associated with a particular cluster 201 to be relocated, to or from, another cluster 221, 231 in the system 200. Effectively, due to these advantageous relocation capabilities of the target MUX 217, target cables 241 coupling target systems 240 to a user IO panel 219 may directly or indirectly connect the target systems 240 to nearly any domain (e.g., emulation chip 209) of the board cluster 201 or emulation system 200. Each target system 240 may be dynamically associated with any number of domains (e.g., emulation chips 209). That is, rather than having fixed connections, as in conventional system, a target MUX 217 allows the emulator system 200 to redefine which target connectors 218 communicate data to which domains, such that some or all of the target systems 240 may be connected to some or all of the domains of the system 200.

In operation, a target MUX 217 may be dynamically reprogrammable while the emulation system 200 is executing various emulation routines; this may be accomplished without disrupting the other, ongoing emulator routines. For instance, an ongoing emulation routine may be executed that connects a first chip 209a of a first domain, and a first target system 240a, which leaves available a second chip 209b, of a second domain, and a second target system 240b. A configuration manager module monitoring allocation and usage of resource may identify that the both the second chip and 209b and the second target 240b are available, even though they are both currently configured to communicate with the unavailable resources that are currently executing an ongoing emulation routine. The configuration manager may generate and distribute new instructions to one or more cluster control components, such as a target MUX 217, to redirect the data traffic for a new emulation routine involving the second chip 209b of the second and the second target 240b. In other words, a target MUX 217 may be dynamically reprogrammed to drive signals carrying data between the second chip 209b of the second domain and the second target 240b, even though the second chip 209b and second target 240b were previously configured to—according to their respective instruction sets—communicate with different resources of the system 200. The target MUX 217 therefore dynamically connects the second chip 209b of the second domain with the second target 240b, without disrupting the ongoing emulation routine involving the first chip 209a and the first target 240a.

Connectivity Between the System and Target Systems

A user IO panel 219 may be connected directly to a cluster control board 203 or a cluster bus 207. In some embodiments, the user IO panel 219 may be connected to the cluster control board 203 via one or more system buses 220. As such, the user IO panel 219 may be directly or indirectly connected to any number of target MUXs 217, of any number of clusters 201, 221, 231. Coupled to the IO panel 219 may be any number of target cable connectors 218. Target cable connectors 218 may be hardware interfaces coupling a board cluster 201 or emulation system 200, to the user IO panel 219 or directly to target systems 240. In some embodiments, the target cable connectors 218 may be the interface components of the user IO panel 219. The target cable connectors 218 may be any hardware wiring and interfaces capable of transporting data between a target mux 217 and a target system 240. In operation, each target cable connector 218 may be associated with one or more addresses or pins of the target mux 217, such that the target mux 217 is instructed to select data from, or output data to, a particular address or pin, either by the target mux's 217 own instruction set or by an instruction received from another component of the system 200 (e.g., chip 209, target system 240).

The target cable connectors 218 and the IO panel 219 may comprise any number of ports and interfaces configured to transport data to target systems 240 through the target cables 241 physically coupling the target systems 240 to the IO panel 219. For example, a target system 240a may comprise a target pod that communicates through Ethernet to the system 200. In this example, the target cables 241 may comprise any number of Ethernet cables (e.g., Cat 5 cables), that couple to an RJ45 interface of the IO panel 219. The target cable connectors 218 may comprise any number of logical and physical interfaces configured to convey data signals to and from the target MUX 217. Then, operating in accordance with the instruction set of the target MUX 217, the target MUX 217 may select inputs from a port or pin associated with that target system 240a to drive the signals to a particular domain, or may drive outputs through the port or pin associated with the target system 240a to the target pod of the target system 240a.

Exemplary Method

Figure 3:
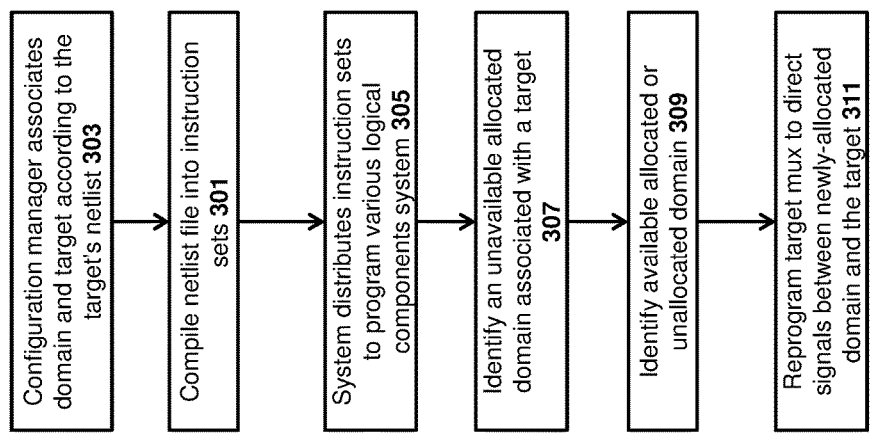
FIG. 3 shows an exemplary method for switching which domain communicates with a target pod, according to an exemplary embodiment.

FIG. 3 shows an exemplary method 300 for switching which domain communicates with a target pod, according to an exemplary embodiment. The exemplary embodiment is shown comprising steps 301, 303, 305, 307, 309, and 311, but it should be appreciated that other embodiments may comprise any number of additional or alternative steps not described herein, or may omit one or more of the steps seen in FIG. 3.

In the exemplary embodiment, the target system and the emulation system may communicate data signals via a target pod. But it should be appreciated that a distinct, target pod device is not required in all embodiments. In the exemplary method 300, each domain comprises a single emulation chip. However, as previously mentioned, domains may be the smallest unit of resources the emulation system is capable of allocating to a particular emulation. So it should be appreciated that a domain may comprise and be defined by any number of resources of the emulation system, at any level of hierarchical level of execution. Other non-limiting examples of domains may include one or more processors residing on an emulation chip; a plurality of emulation chips; whole logic boards comprising clusters of chips; clusters of logic boards; and so forth. In many cases, domains—e.g., the smallest unit of components that may be allocated to an execute aspects of an emulation—may be defined by the capability of the configuration manager to schedule independent execution of an emulation's routines for that set of components. For example, in the exemplary method 300 each domain comprises an emulation chip because the emulation system is capable of allocating and scheduling each respective emulation chip to execute the emulation routines for an emulation of a target system, independently from the other emulation chips and independently from a system clock.

Prior to emulation testing, engineers may prepare a netlist file representing a logic system that is under development and/or requires testing. The netlist file may be provided to the emulation system in any number of ways. For example, an engineer may transmit the netlist file over one or more public or private networks to the emulation system, from client device operated by the engineer. In another example, the engineer or administrator of the emulation system may directly input the netlist file into an administrative computer or integrated user interface, able to configure, monitor and control the emulation system. Upon receiving the netlist file, software modules of the emulation system may compile the netlist file into machine-readable instructions for the various processors and multiplexers of the system. In some cases, the emulation system may automatically execute the emulation processes as described in FIG. 3; and in some cases, the emulation system may wait for various data inputs, operational configurations, and/or instructions from the user interfaces of client devices and/or administrator devices, before executing the emulation processes as described in FIG. 3.

In a first step 301, after receiving a netlist file for a target system, one or more software modules of the emulation system, such as a configuration manager, may associate one or more domains of the emulation system with a target pod of the target system. That is, after receiving the netlist file, the configuration manager may automatically or manually allocate domains to execute an emulation provided for the target system. After being allocated to execute the target system's emulation, the domain is then logically associated with the target pod of the target system. In some implementations, the configuration manager, or other software module, stores a record of the allocation into a memory location (e.g., database record, machine-readable file listing allocations) that is used to track and update the domain allocations. This record may contain information concerning the allocations, such as domain identifiers, target pod identifiers, and an indication that an allocated domain is associated with a target pod, among other types of information.

In order to identify which domains are available to be allocated to the target pod, the configuration manager may automatically determine, at or before compile time, which domains are available or unavailable. This may include identifying whether a domain is busy, non-functional, non-responsive, or otherwise not available to execute the emulation routines for the particular emulation. Additionally or alternatively, the configuration manager may reference the memory location storing record of the allocations, which may indicate available and unavailable domains, based on whether they were already allocated to another target pod. From the available domains identified, the configuration manager may select one or more domains to be allocated to the target pod according to any number of predetermined criteria, such as logical or physical distance between a domain and the target pod, the size of the domain (e.g., an emulation requires a domain having three emulation chips), the number of domains required (e.g., an emulation requires three domains of one emulation chip, so the three emulation chips must be contiguous), processing power of the domain's resources, and compatibility (e.g., functional capabilities of resources of the domain).

In some embodiments, a user (e.g., end user, administrator) may manually select one or more domains to be allocated and associated to the target pod. The user may also manipulate or otherwise change allocations that were automatically generated by the configuration manager. The user may access a user interface that accepts inputs from the user and then provides those inputs to the configuration manager, or other software module of the emulation system, in the form of executable instructions for the emulation system. The user interface may be accessed through a terminal that is integrated into the devices of the emulation system, proximate to the emulation system, or at a remote location. For example, a user interface capable of monitoring and/or configuring aspects of the emulation system may be found at a user I/O panel that is integrated into the physical housing containing the emulation devices. As another example, a user interface may be accessed at a client computing device that is remotely located and is capable of monitoring and configuring aspects of the emulation execution over one or more networks.

The software modules providing the functionality of the configuration manager may be executed by any number of computing devices comprising a processor capable of performing one or more tasks or processes of the configuration managers, such as determining domain requirements, detecting domain availability, and scheduling and monitoring execution of various emulation routines by domain resources, among others.

In a next step 303, one or more software modules of the emulation system, such as a compiler program, may compile a machine-readable netlist file and then generate instruction sets to be executed by various integrated circuits in the emulation system. Software modules providing the compiler functions may be executed by any number of computing devices comprising a processor capable of performing one or more tasks or processes of the compiler. For example, software modules functioning as a compiler may be capable of parsing and compiling the netlist file into machine-readable instruction sets for various integrated circuits of the emulation system to execute, thereby configuring those integrated circuits to emulate the logic system represented by the netlist file. As part of the compilation, each of the instructions compiled for the circuits of the emulation system should indicate an input source and/or an output destination for each execution step. For a domain (e.g., emulation chip), the sources and destinations should correspond to, and ultimately direct data signals to, the target pod allocated to the domain.

In a next step 305, the configuration manager or other software module of the system may distribute instructions to the appropriate devices and circuits of the emulator system, such as the processors of the emulation chips and target MUXs. In the example of emulation chips, the instructions provided to an emulation chip may configure the emulation chip to execute one or more portions of an emulation, and may instruct the emulation chip which data signal inputs to select and where to output data signal outputs. In the example of the target MUXs, the instructions provided to a target MUX may configure the target MUX to direct data signals between domains and target pods. For instance, where a first domain comprises a first emulation chip configured to execute an emulation received from a first target system, the instruction set of the target MUX may instruct the target MUX to direct data signals between the first emulation chip and the first target pod.

In a next step 307, the configuration manager may detect and determine that a domain allocated to a target system is unavailable. The resources of the domain may go offline, become unavailable, or there may be a queue for the resources of the domain, and thus the resources of the domain are busy. In some embodiments, the configuration manager may update database records storing the status of domains of the system.

In a next step 309, after detecting and determining that an allocated domain is busy or unavailable to execute an emulation, the configuration manager may then query, detect, and identify an available domain, which may be allocated or unallocated to execute another emulation. Here, the configuration manager may query a database of domain statuses, a query the status of the domain hardware (e.g., query the emulation chip status), to identify which domain of the system could execute an emulation that was previously allocated to a now-unavailable or overburdened domain.

In a next step 311, after the configuration manager identifies an available domain to reallocate an emulation, the emulation system may reconfigure (e.g., reprogram) the target MUX to direct data signals between the identified available domain and the target pod associated with the emulation. In some instances, the instruction sets of the domain resources would not need to be reprogramed, nor would the instructions sets of the target pods, because the target MUX would intelligently redirect the data signals in accordance with the updated, reprogramming of the target MUX.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method for adaptively driving signals among components of an emulation system, the method comprising:
   receiving, by a target multiplexer of an emulation system, one or more signals from a first domain of resources of the emulation system, the one or more signals outputted by the first domain to a first target pod coupled to the emulation system;
   detecting, by a system management module of the emulation system, an unavailable domain of the emulation system corresponding to the first target pod configured to receive at least one signal from the unavailable domain;
   identifying, by the system management module, one or more available domains of the emulation system, wherein the first domain is in the one or more available domains;
   generating, by the system management module, a target value of a second instruction set executed by the target multiplexer;
   transmitting, by the system management module, the target value of the second instruction set to the target multiplexer; and
   transmitting, by the target multiplexer, the one or more signals to a second target pod according to the target value instruction of the second instruction set executed by the target multiplexer, such that the target multiplexer dynamically switches between unavailable and available domains.

2. The method according to claim 1, further comprising, outputting, by at least one component of the first domain, the one or more signals to the first target pod according to the target value of a first instruction set executed by the at least one component of the first domain.

3. The method according to claim 1, further comprising receiving, by the target multiplexer, a first instruction set comprising the target value instructing the target multiplexer to transmit the one or more signals to the first target pod.

4. The method according to claim 3, wherein the first instruction set is received from a compiler of the emulation system.

5. The method according to claim 4, further comprising, upon the target multiplexer receiving the second instruction set:
   updating, by the target multiplexer, the target value of the first instruction set according to the target value of the second instruction set instructing the target multiplexer to transmit the one or more signals to the second target pod.

6. The method according to claim 5, further comprising receiving, by the target multiplexer, the target value of the second instruction set via a user interface executed by an administrative device.

7. The method according to claim 1, further comprising receiving, by the target multiplexer, from a system management module of the emulation system the target value of the second instruction set.

8. The method according to claim 1, wherein the domain comprises at least one component selected from the group consisting of: a processor, a cluster of processors, a chip, a cluster of chips, a multiplexer, a logic board, and a cluster of logic boards.

9. A circuit emulation system comprising:
one or more domains of system components, each respective domain comprising one or more processors of the emulation system, each respective processor configured to execute one or more processing jobs according to an instruction set executed by the respective processor, each domain configured to output one or more signals to at least one target pod identified by a target value of an instruction set executed by component of the domain;
a system manager module configured to:
detect an unavailable domain corresponding to a first target pod configured to receive at least one signal from the unavailable domain;
identify a first available domain of the emulation system;
transmit to a target multiplexer a target value of a second instruction set, thereby updating corresponding target value of a first instruction set executed by the target multiplexer, the target value of the second instruction set instructing the target multiplexer to transmit the one or more signals from the first domain to a second target pod; and
the target multiplexer configured to receive the one or more signals outputted by the domain to a first target pod, and transmit the one or more signals to the second target pod in accordance with the target value of the second instruction set executed by the target multiplexer, such that the target multiplexer dynamically switches between unavailable and available domains.

10. The system according to claim 9, further comprising one or more target pods, each target pod comprising a processor configured to execute one or more instructions of an emulation program using the one or more signals received from at least one domains.

11. The system according to claim 10, wherein the components of the one or more domains are further configured to execute one or more instructions of each instruction set using one or more input signals received from the at least one target pod.

12. The system according to claim 9, wherein at least one component of a domain of the emulation system is selected from the group consisting of: a processor, a cluster of processors, a chip, a cluster of chips, a logic board, and a cluster of logic boards.

13. The system according to claim 9, further comprising a second target multiplexer configured to receive the one or more signals from the first domain and transmit the one or more signals to a second domain of the one or more domains in accordance with a target value of the instruction set executed by the second target multiplexer.

14. The system according to claim 9, further comprising a system manager module executed by at least one processor of the emulation system, the system manager module configured to identify one or more unavailable domains, and identify one or more target pods configured to receive at least one data signal from at least one unavailable domain,
wherein the second target pod is in the one or more target pods configured to receive the at least one data signal from the at least one unavailable domain.

15. The system according to claim 14, wherein the system manager module is further configured to identify one or more available domains, wherein the first domain is in the one or more available domains.

16. The system according to claim 9, wherein each domain of the emulation system is associated with an independent clock scheduling execution of each instruction set of the components of the respective domain independent of a system clock of the emulation system.

17. The system according to claim 16, wherein each processing job is associated with a set of one or more instruction sets to be executed by a set of one or more domains having the same independent clock.

* * * * *